(12) United States Patent
Piernas

(10) Patent No.: US 10,749,490 B1
(45) Date of Patent: Aug. 18, 2020

(54) PIN DIODE BIAS SCHEME TO IMPROVE LEAKAGE CHARACTERISTICS AND P1DB THRESHOLD LEVEL OF REFLECTIVE LIMITER DEVICE

(71) Applicant: MACOM Technology Solutions Holdings, Inc., Lowell, MA (US)

(72) Inventor: Belinda Piernas, Mason, NH (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 0 days.

(21) Appl. No.: 15/876,565

(22) Filed: Jan. 22, 2018

(51) Int. Cl.
*H03G 11/02* (2006.01)
*H04B 1/44* (2006.01)
*H04B 1/3822* (2015.01)

(52) U.S. Cl.
CPC .......... *H03G 11/02* (2013.01); *H04B 1/3822* (2013.01); *H04B 1/44* (2013.01)

(58) Field of Classification Search
CPC ........ H03G 11/00; H03G 11/02; H03G 11/08; H03G 11/06
USPC .......................................... 333/17.2, 12, 81 R
See application file for complete search history.

(56) References Cited

U.S. PATENT DOCUMENTS 5,300,900 A * 4/1994 Bellantoni ........... H03G 11/025
327/309

* cited by examiner

*Primary Examiner* — Stephen E. Jones
(74) *Attorney, Agent, or Firm* — Thomas | Horstemeyer, LLP; Jason M. Perilla

(57) ABSTRACT

An apparatus includes an input port, an output port, a first bias input, a first shunt PIN diode, a first radio frequency (RF) choke inductor, and a first direct current (DC) blocking capacitor. The input port may be connected to the output port, a first terminal of the first shunt PIN diode, and a first terminal of the first RF choke inductor. A second terminal of the first RF choke inductor is connected to a first terminal of the first DC blocking capacitor and the first bias input. A second terminal of the first shunt PIN diode and a second terminal of the first DC blocking capacitor are connected to a circuit ground potential. A first bias voltage having a magnitude lower than a knee voltage of the first shunt PIN diode is applied at the first bias input.

20 Claims, 9 Drawing Sheets

PIN DIODE BIAS SCHEME TO IMPROVE LEAKAGE CHARACTERISTICS AND P1DB THRESHOLD LEVEL OF REFLECTIVE LIMITER DEVICE

FIELD OF THE INVENTION

The invention relates to receiver protection limiters generally and, more particularly, to a method and/or apparatus for implementing a PIN diode bias scheme to improve leakage characteristics and P1dB threshold level of a reflective limiter device.

BACKGROUND

Limiters are most commonly used in radar systems and front-end modules of radio frequency transceivers where both the transmitter and the receiver are tuned to approximately the same frequency. In both of these systems, the receiver part needs to be highly sensitive to reliably detect and amplify very weak incident signals, and, therefore, will likely be damaged by even a small portion of the transmitted power leaking through or being reflected back to the receiver.

In conventional systems, a passive PIN diode reflective limiter device is used on the front end to protect the receiver components. The response of such a passive limiter is not ideal and the leakage characteristics (flat and spike leakage) as well as the 1 dB compression (P1dB) threshold are intimately related to the physics of the PIN diode, the diode geometry and the frequency of the input signal. The flat and spike leakage characteristics as well as the threshold level of the limiter are key characteristics of a limiter as they determine the level of isolation that can be provided to protect a receiver.

Previous efforts to lower the leakage characteristics of reflective PIN diode limiter devices have included the development of PIN diodes on a thinner epitaxial I-layer. The thinner the I-layer, the lower the leakage characteristics. However, when thinning the epitaxial I-layer, the off-state diode capacitance increases significantly, resulting in limiter devices of higher insertion loss and limited bandwidth. Thinning the epitaxial I-layer also results in lower power handling capacity.

Alternative efforts to lower the leakage characteristics while maintaining the power handling capacity involve the development of multi-stage limiters. For a two-stage limiter, the first (input) stage uses a large diode to provide the coarse level of isolation with the desired power handling capability while the second (output) stage, commonly referred to as the clean-up stage, uses a smaller diode to provide the remaining level of isolation with the desired low leakage and threshold level. If the limiter is required to handle a very large input signal, a third stage with a larger diode may be added to the input. For proper operation, the limiting diodes of a multi-stage limiter need to be placed one quarter wavelength ($\lambda/4$) from each other resulting in a relatively large and expensive circuit.

Hybrid limiters usually benefit from both approaches with the coarse limiting diode(s) being developed on a thick epitaxial I-layer for better power handling capability, while the clean-up diode is developed on a thinner epitaxial I-layer for lower flat leakage and P1dB threshold level. Hybrid technology however has the disadvantage of very large device size and high cost.

Monolithic microwave integrated circuit (MMIC) limiters can be highly integrated and low cost, but all limiting diodes of the circuit need to be implemented on the same epitaxial I-layer thickness, resulting in overall lower performance than hybrid limiters. For those limiters, a trade-off has to be made between insertion loss, bandwidth, power handling capability, flat leakage, and P1dB threshold level.

With the current diode technology capability, the thinnest thickness of epitaxial I-layer that can be implemented with good reliability is 1 µm. For MMIC passive limiters, the best trade-off between small-signal characteristics and power characteristics results in an epitaxial I-layer thickness of 2 µm.

For a given diode, the improvement on the flat leakage characteristics from 3 µm I-layer thickness to 2 µm I-layer thickness is only on the order of 1 dB to 1.5 dB. However, the off-state diode capacitance increases by 50%, resulting in significant degradation of the reflective limiter small-signal performances (e.g., insertion loss, return losses, and/or bandwidth).

It would be desirable to implement a PIN diode bias scheme to improve leakage characteristics and P1dB threshold level of a reflective limiter device without significant degradation of the small-signal performance.

SUMMARY

The invention concerns an apparatus including an input port, an output port, a first bias input, a first shunt PIN diode, a first radio frequency (RF) choke inductor, and a first direct current (DC) blocking capacitor. The input port may be connected to the output port, a first terminal of the first shunt PIN diode, and a first terminal of the first RF choke inductor. A second terminal of the first RF choke inductor is connected to a first terminal of the first DC blocking capacitor and the first bias input. A second terminal of the first shunt PIN diode and a second terminal of the first DC blocking capacitor are connected to a circuit ground potential. A first bias voltage having a magnitude lower than a knee voltage of the first shunt PIN diode is applied at the first bias input.

BRIEF DESCRIPTION OF THE FIGURES

Embodiments of the invention will be apparent from the following detailed description and the appended claims and drawings in which:

DETAILED DESCRIPTION OF THE EMBODIMENTS

Figure 1:
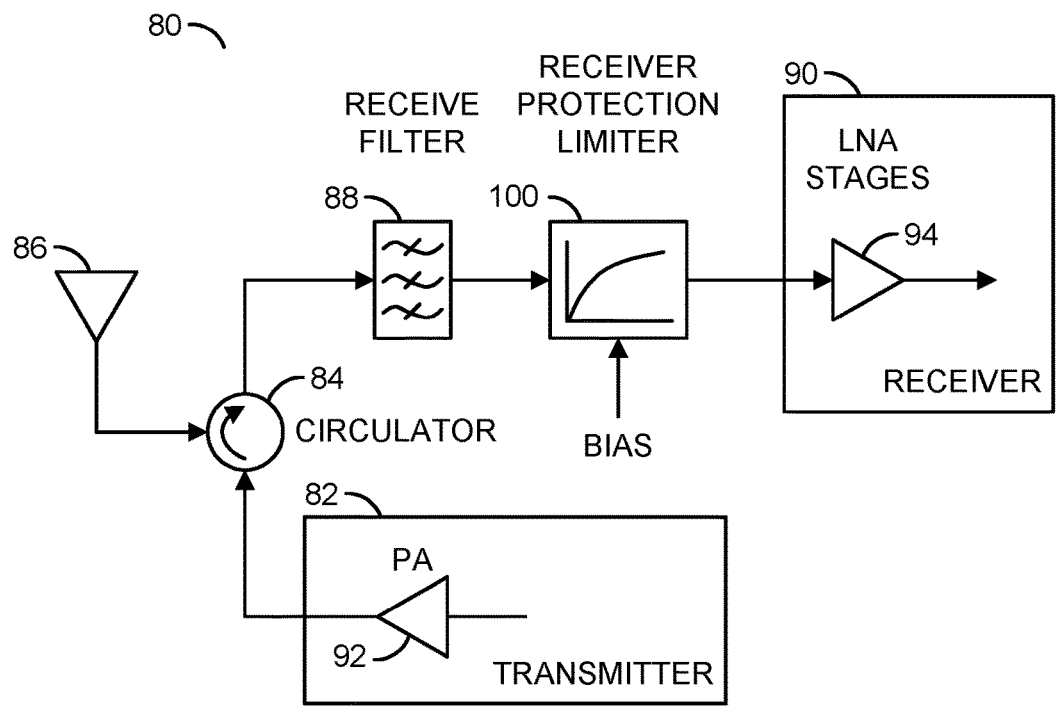
FIG. 1 is a diagram illustrating an example context in which an embodiment of the invention may be implemented.

Embodiments of the present invention include providing a PIN diode bias scheme to improve flat and spike leakage characteristics as well as P1dB threshold level of a reflective limiter device that may (i) bias a shunt PIN diode at a positive voltage below a knee voltage of the diode, (ii) allow control of the flat and spike leakage, (iii) allow control of the P1dB threshold point at which the device starts limiting, (iv) provide improved performance of the limiter regardless of epitaxial I-layer thickness, (v) improve leakage characteristics without significantly degrading small signal characteristics (e.g., insertion loss, return losses, bandwidth) and power handling capability, and/or (vi) be implemented in one or more stages of a limiter circuit.

Receiver protection limiters, commonly referred to simply as "limiters", are used to protect front-end radio frequency (wireless) and radar receivers from a large incident signal. In various embodiments, the invention provides a method and/or apparatus for improving the response of PIN diode reflective limiters to a large signal by lowering the leakage characteristics and controlling the threshold level at which the limiter exhibits a 1 dB compression of the input signal. In various embodiments, the present invention generally encompasses method and/or an apparatus aspects for improving the response of reflective PIN diode limiters to a large signal by lowering flat leakage, spike leakage, and 1 dB compression (P1dB) threshold voltage without compromising the small signal and power characteristics of the device (or circuit). In various embodiments, an approach is used that involves utilizing the diode characteristics when biased at a positive voltage below the knee voltage of the diode. Embodiments of the invention may be particularly suited to improving performance of reflective PIN diode-based monolithic microwave integrated circuit (MMIC) limiters.

In various embodiments, the invention may be applied to single-stage reflective diode limiters, as well as multi-stage limiters. Depending on the desired performance, one or multiple diodes of the limiter may be biased either at the same bias voltage (described in more detail below in connection with FIG. 3) or at different bias voltages (described in more detail below in connection with FIG. 4), as long as each individual bias voltage remains positive and below the knee voltage of the respective diode in order to not alter the small signal and power characteristics of the limiter if un-biased (VD=0V).

PIN diodes are widely used in radio frequency (RF), microwave and millimeter-wave circuits for a multitude of applications. Regardless of the technology (GaAs, GaN, Si, etc.), PIN diodes are formed by a very lightly doped (high impedance) epitaxial intrinsic layer, referred to as the I-layer, sandwiched between two heavily doped p-type and n-type layers, respectively, referred to as the P Anode and N Cathode region. The resulting electrical structure arising from this physical structure is a variable resistance that may be modulated either by applying a forward (positive) DC bias or, in the case of a passive limiter device, by applying a large input signal (continuous wave (CW) or pulsed).

When a small CW incident signal is applied to the limiting PIN diode in a shunt configuration, the electric field resulting from the incident signal is not large enough to force carriers to move from the P Anode and N Cathode region into the I-layer, and the diode remains in an off-state mode. In the off-state mode, the impedance of the diode is mostly characterized by an off-state capacitor Coff and a very high resistance. The insertion loss of the limiter is then at a minimum and mostly determined by the small mismatch loss due to the capacitive reactance of the diode.

As the incident CW signal (power) applied to the limiting PIN shunt diode increases above a certain threshold level (referred to as the 1 dB compression (P1dB) threshold level), the electric field resulting from the incident signal temporarily forces carriers to move from the P Anode and N Cathode region into the I-layer. The I-layer, originally highly resistive in the off-state mode, becomes more conductive and exhibits a much lower resistance. The resulting resistance value is controlled by the amount of power applied. The impedance mismatch due to the sudden change of impedance in the shunt diode becomes significant and most of the incident CW signal (power) is reflected to the source. The amount of power leaking through the limiter is referred to as flat leakage. By reflecting the power rather than dissipating it, the limiter may potentially handle a large amount of power without damage. This applies until the diode reaches its saturation region where the RF current through the diode increases rapidly, causing the diode to fail.

When the incident input signal (power) applied above the threshold voltage of the diode is pulsed, the diode initially remains in the off-state mode, and, apart from the small mismatch loss created by the off-state capacitor, all the incident power passes through the limiter. After sufficient time has passed allowing the carriers to transit through the I-layer (carrier transit time), the diode impedance switches to a low value and the power is attenuated to the level of the flat leakage. The maximum power leak through the limiter at the beginning of the pulse and before the establishment of the flat leakage is referred to as spike leakage.

The characteristics of the reflective PIN diode limiter under incident signal drive, such as flat leakage, spike leakage and the P1dB threshold, are intimately related to the physics of the PIN diode (e.g., thickness of the I-layer), the diode geometry, and the frequency of the input signal. When the large incident CW or pulsed signal (power) is no longer present, the diode switches back into the off-state mode with a high impedance. In practice, this change of impedance occurs after a short delay known as recovery time that is needed for the free carriers present in the I-Region to dissipate.

Alternatively to driving the diode with a large incident signal (power), a change of impedance in the diode may be achieved by applying a forward (positive) DC bias across the diode. When a forward bias is applied across the diode, the electrical field resulting from the applied voltage modifies the energy band diagram of the diode. The modification of the energy band diagram of the diode creates a wider depletion region that goes beyond the I-region and facilitates the injection of carriers from the P Anode and N Cathode region into the depletion region. Above a certain level of applied voltage (referred to as the knee voltage), the carriers enter the depletion region and as the two carriers meet, current starts to flow. Above the knee voltage, the PIN diode is in its on-state mode. In the on-state mode, the PIN diode behaves like a series resistance RS that may be modulated by the amount of DC voltage applied. This phenomenon is widely exploited for the design of attenuators and switches where the PIN diode is modulated between the on-state and the off-states modes, respectively.

In various embodiments, a forward bias voltage is applied to a PIN diode in a shunt configuration in order to modify the energy band diagram of the diode. By maintaining the bias voltage well below the knee voltage of the diode, the diode may be kept in the off-state mode, and the small-signal characteristics of the limiter circuit remain unchanged. However, by modifying the energy band diagram of the P-I-N junctions, the applied bias voltage facilitates a potential transfer of carriers from the P Anode and N Cathode region into the I-region. When an incident signal (power) is applied to the limiting PIN diode in the shunt configuration, the amount of signal (power) needed to force the carriers to move from the P Anode and N Cathode regions into the I-layer is less than if the diode was unbiased. As a consequence, the P1dB threshold level as well as the flat and spike leakage decrease proportionally with the applied forward voltage. This phenomenon is independent of the physics (I-layer thickness) or size of the PIN diode.

In various embodiments, the leakage characteristics may be significantly enhanced and may exhibit performance superior to a non-biased diode developed on a thinner epitaxial I-layer without degradation of the small signal characteristics. When used in conjunction with multi-stage configurations, superior power handling with ultra-low leakage characteristics may be achieved on a thicker epitaxial I-layer. Regardless of the epitaxial I-layer thickness, PIN diode-based limiter devices implemented in accordance with embodiments of the invention generally provide a double advantage of being able to control both the P1dB point at which the device starts limiting as well as the level of the spike and flat leakage. In an example, using a standard 3 μm thick I-layer process, 8-10 dB improvement in the flat leakage for a small diode and 6-7 dB improvement on larger diodes have been demonstrated, without significantly affecting the small signal characteristics (e.g., insertion loss, return losses, and/or bandwidth).

Referring to FIG. 1, a block diagram of a transceiver circuit 80 is shown illustrating an example context in which an embodiment of the invention may be implemented. A typical transceiver circuit 80 generally comprises a transmitter chain and a receiver chain configured to share an antenna. In an example, an output of a transmitter 82 may be coupled to a first port of a circulator 84. A second port of the circuit 84 may be coupled to an antenna 86. A third port of the circulator 84 may be coupled to an input of a receive filter 88. An output of the receive filter 88 may be coupled to a receiver 90 by a receiver protection limiter circuit 100 implemented in accordance with an example embodiment of the invention.

The output of the transmitter 82 is generally provided by an output stage comprising a number of power amplifiers (PA) 92. The input to the receiver 90 is generally received by one or more low noise amplifier stages (LNA) 94. The LNA 94 is generally highly sensitive to reliably detect and amplify very weak incident signals, and, therefore, may be damaged by even a small portion of the transmitted power from the PA 92 leaking through or being reflected back to the receiver 90. In order to protect the input of the LNA 94, the receiver protection limiter device (or circuit) 100 may comprise a biased shunt PIN diode reflective limiter circuit in accordance with an embodiment of the invention. In various embodiments, the biased shunt PIN diode reflective limiter circuit 100 may provide a high speed limiter circuit capable of protecting the low noise amplifier stages 94 of the receiver 90.

Figure 2:
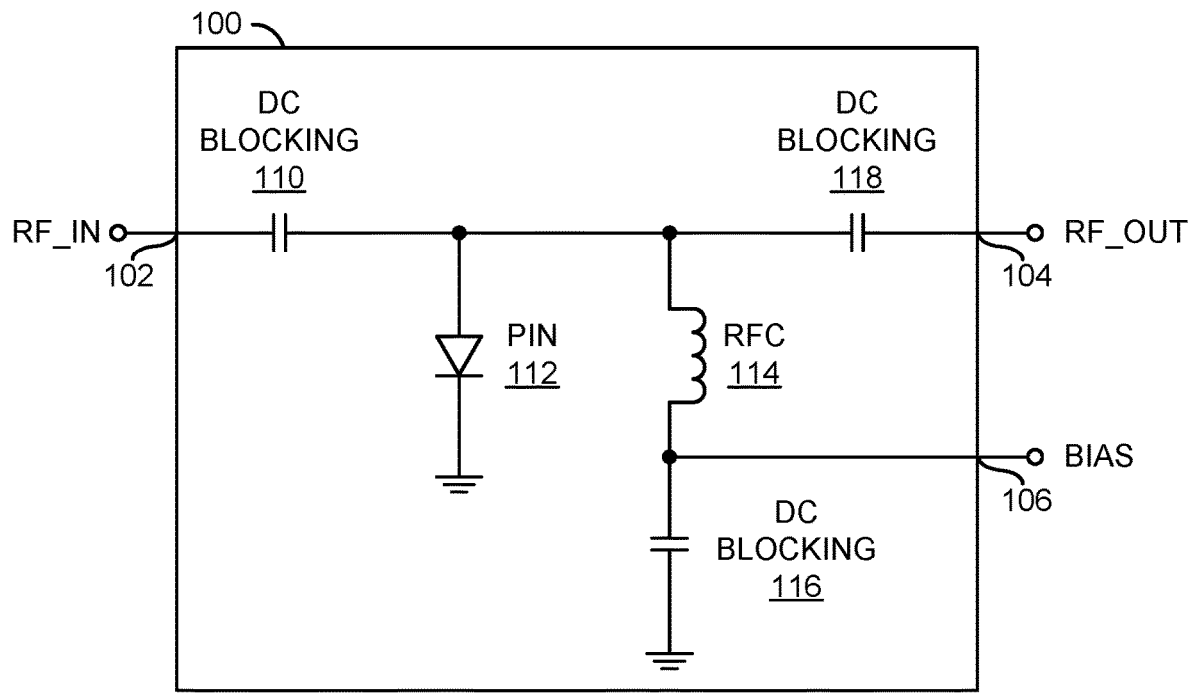
FIG. 2 is a diagram illustrating an example of a single-stage biased limiter device in accordance with an example embodiment of the invention.

Referring to FIG. 2, a diagram is shown illustrating an example implementation of the circuit 100 as a single-stage biased PIN diode reflective limiter device in accordance with an example embodiment of the invention. In various embodiments implementing a single-stage limiter, the circuit 100 may comprise an RF input port 102, an RF output port 104, a bias terminal 106, a shunt PIN diode 112, a parallel RF choke 114, and a DC blocking capacitor 116. The parallel RF choke 114 is selected to have a low DC resistance as to not alter the performance of the diode 112. The DC blocking capacitor 116 may be connected in series with the RF choke 114 for RF ground return. A DC blocking capacitor 110 and a DC blocking capacitor 118 may be inserted at the RF input port 102 and the RF output port 104, respectively, to DC isolate the circuit 100. The DC blocking capacitor 110 and a DC blocking capacitor 118 do not directly contribute to the limiting characteristics of the circuit 100 but are generally inserted for convenience of use of the limiter.

In various embodiments, the input port 102 may receive a radio frequency (RF) input signal (e.g., RF_IN), the output port 104 may present a radio frequency (RF) output signal (e.g., RF_OUT), and the bias terminal 106 may receive a bias voltage (e.g., BIAS). In an example, the bias voltage BIAS may comprise a positive voltage configured to be below a knee voltage of one or more PIN diode(s) implementing the shunt PIN diode 112.

In an example, the RF input port 102 may be coupled to a first terminal of the DC blocking capacitor 110. A second terminal of the DC blocking capacitor 110 may be coupled to a first (e.g., anode) terminal of the PIN diode 112, a first terminal of the RF choke 114, and a first terminal of the DC blocking capacitor 118. A second terminal of the DC blocking capacitor 118 may be coupled to the RF output port 104. A second terminal of the RF choke 114 may be coupled to a first terminal of the DC blocking capacitor 116 and the bias terminal 106. A second (e.g., cathode) terminal of the PIN diode 112 and a second terminal of the DC blocking capacitor may be coupled to a circuit ground terminal or plane (e.g., GND). In various embodiments, the PIN diode 112 may be implemented with any available PIN diode technology including, but not limited to a silicon (Si) diode, a gallium arsenide (GaAs) diode, or a gallium nitride (GaN) diode.

In various embodiments, the bias voltage BIAS comprises a positive bias voltage that is applied to the PIN diode 112 of the limiter 100. The selected bias voltage is generally below a knee voltage of the PIN diode 112. As the bias voltage increases, but stays well below the knee voltage, the leakage characteristics of the PIN diode 112 are enhanced. The biased PIN diode 112 generally exhibits superior performance compared to a non-biased diode developed on a thinner epitaxial I-layer, and without significant degradation of the small signal characteristics (e.g., insertion loss, return losses, bandwidth, etc.).

Figure 3:
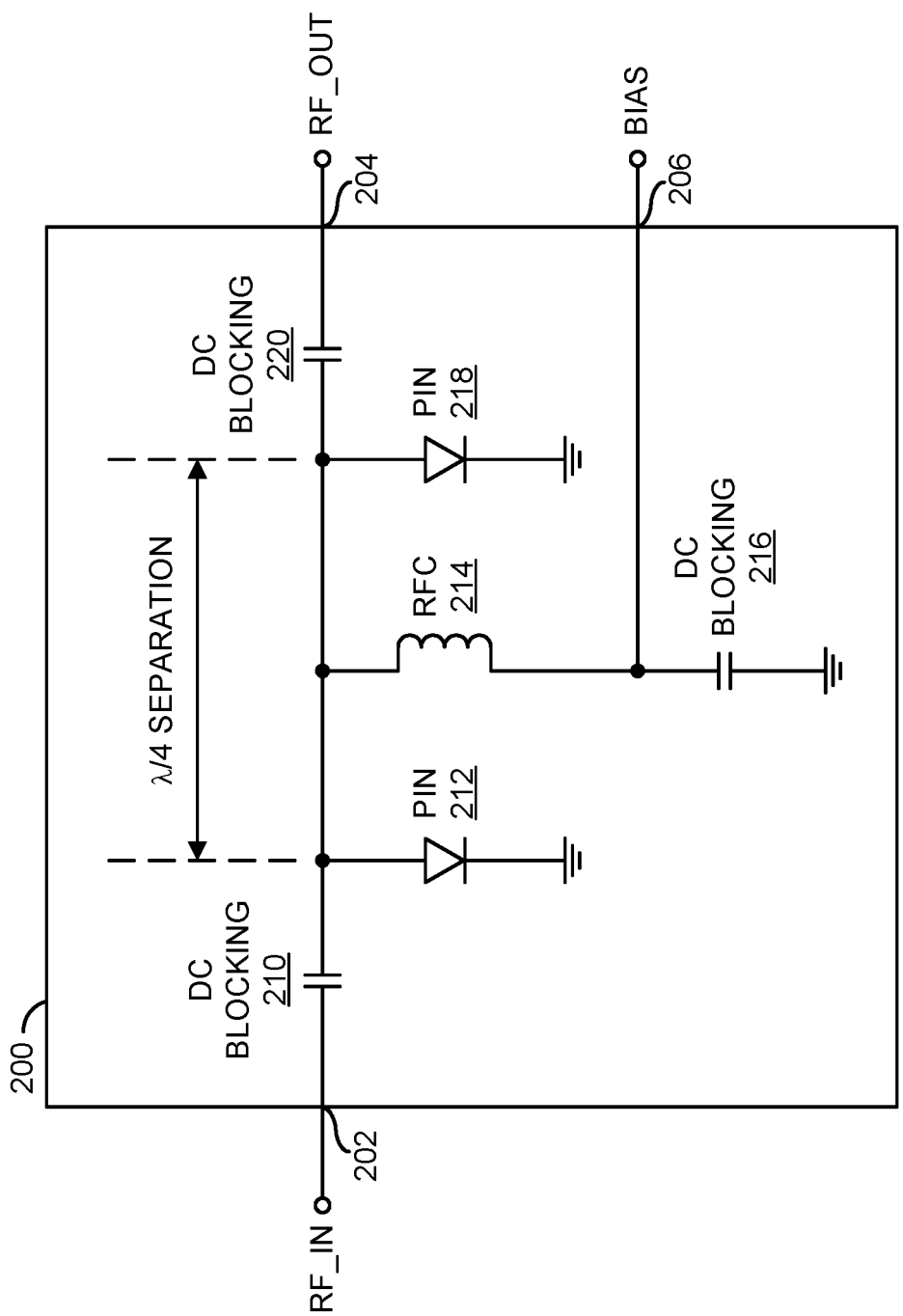
FIG. 3 is a diagram of illustrating an example of a two-stage biased limiter device utilizing a single bias voltage in accordance with another example embodiment of the invention.

Referring to FIG. 3, a diagram of a circuit 200 is shown illustrating an example of a two-stage limiter device (circuit) in accordance with an example embodiment of the invention. In an example, the circuit 200 may be used in place of receiver protection limiter circuit 100 of FIG. 1. In an embodiment implementing a two-stage biased PIN diode reflective limiter circuit, the circuit 200 may comprise an RF input port 202, an RF output port 204, a bias input terminal 206, a first shunt PIN diode 212, a parallel RF choke 214, a DC blocking capacitor 216, and a second shunt PIN diode 218. The parallel RF choke 214 is selected to have a low DC resistance as to not alter the performances of the diodes 212 and 218, respectively. The DC blocking capacitor 216 may be connected in series with the RF choke 214 for RF ground return. A DC blocking capacitor 210 and a DC blocking capacitor 220 may be inserted at the RF input port 202 and the RF output port 204, respectively, to DC isolate the circuit 200.

In various embodiments, the input port 202 may receive a radio frequency (RF) input signal (e.g., RF_IN), the output port 204 may present a radio frequency (RF) output signal (e.g., RF_OUT), and the bias terminal 206 may receive the bias voltage BIAS. The bias voltage BIAS may be used to bias both of the PIN diodes 212 and 218. In an example, the bias voltage BIAS may comprise a positive voltage configured to be below a knee voltage of one or more PIN diode(s) implementing the shunt PIN diodes 212 and 218.

In an example, the RF input port 202 may be coupled to a first terminal of the DC blocking capacitor 210. A second terminal of the DC blocking capacitor 210 may be coupled to a first (e.g., anode) terminal of the PIN diode 212, a first terminal of the RF choke 214, a first (e.g., anode) terminal of the PIN diode 218, and a first terminal of the DC blocking capacitor 220. A second terminal of the DC blocking capacitor 220 may be coupled to the RF output port 204. A second terminal of the RF choke 214 may be coupled to a first terminal of the DC blocking capacitor 216 and the bias terminal 206. A second (e.g., cathode) terminal of the PIN diode 212, a second (e.g., cathode) terminal of the PIN diode 218, and a second terminal of the DC blocking capacitor 216 may be coupled to a circuit ground terminal or plane (e.g., GND). In various embodiments, the PIN diodes 212 and 218 may be implemented as any available PIN diode technology including, but not limited to silicon (Si) diodes, gallium arsenide (GaAs) diodes, or gallium nitrite (GaN) diodes.

In an example, the first (input) stage (e.g., PIN diode 212) may use a large diode to provide the coarse level of isolation with the desired power handling capability, while the second (output) stage (e.g., PIN diode 218), commonly referred to as the clean-up stage, may use a smaller diode to provide the remaining level of isolation with the desired low leakage characteristics and threshold level. If the limiter is desired to handle a very large input signal, a third stage with a larger diode may be added to the input. In general, for optimal performances the PIN diodes 212 and 218 are placed one quarter wavelength ($\lambda/4$) from each other.

In various embodiments, the bias voltage BIAS comprises a positive bias voltage that is applied to the PIN diode 212 and the PIN diode 218. The selected bias voltage is generally below the knee voltages of the PIN diode 212 and the PIN diode 218. As the bias voltage increases, but stays well below the knee voltages, the leakage characteristics of the PIN diodes 212 and 218 are enhanced. The biased PIN diodes 212 and 218 generally exhibit superior performance compared to non-biased diodes developed on a thinner epitaxial I-layer, and without significant degradation of the small signal characteristics (e.g., insertion loss, return losses, bandwidth, etc.). When used in conjunction with a multi-stage configuration, superior power handling with ultra-low leakage characteristics may be achieved on a thicker epitaxial I-layer.

Figure 4:
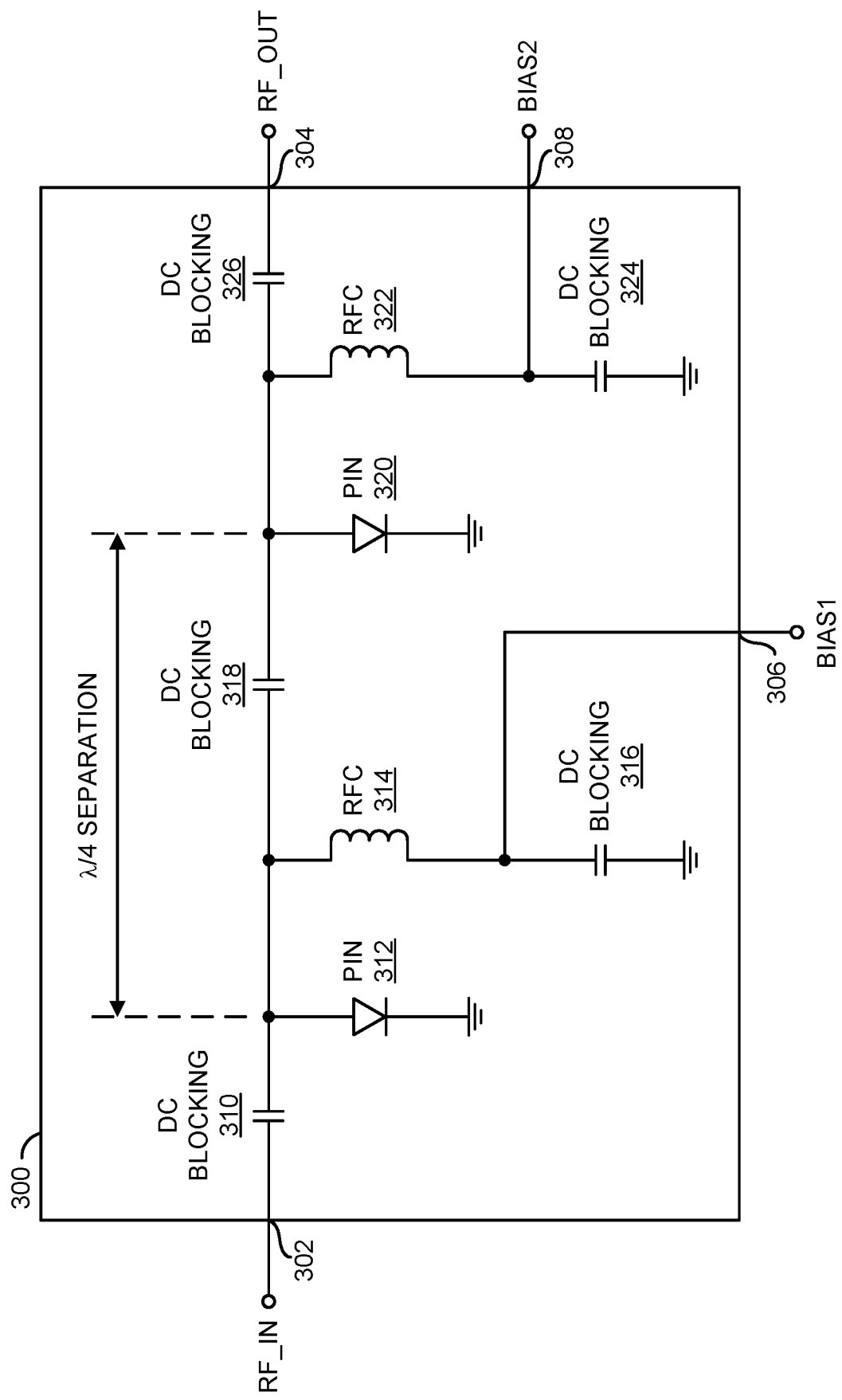
FIG. 4 is a diagram of illustrating an example of a two-stage biased limiter device utilizing two bias voltages in accordance with yet another example embodiment of the invention.

Referring to FIG. 4, a diagram of a circuit 300 is shown illustrating another example of a two-stage reflective limiter device (circuit) in accordance with an example embodiment of the invention. In another example embodiment, a two-stage biased PIN diode reflective limiter circuit 300 may be implemented with each stage biased by a separate bias voltage. In an example, the circuit 300 may be used in place of receiver protection limiter circuit 100 of FIG. 1. In an embodiment implementing a two-stage biased PIN diode reflective limiter circuit with each stage biased by a separate bias voltage, the circuit 300 may comprise an RF input port 302, an RF output port 304, a first bias input terminal 306, a second bias input terminal 308, a first shunt PIN diode 312, a parallel RF choke 314, a DC blocking capacitor 316, a DC blocking capacitor 318, a second shunt PIN diode 320, a second parallel RF choke 322, and a DC blocking capacitor 324. The parallel RF chokes 314 and 322 are selected to have low DC resistances as to not alter the performances of the diodes 312 and 320, respectively. The DC blocking capacitors 316 and 324 may be connected in series with the RF chokes 314 and 322, respectively, for RF ground return. The DC blocking capacitor 318 needs to be connected between the two stages to provide DC isolation. A DC blocking capacitor 310 and a DC blocking capacitor 326 may be inserted at the RF input port 302 and the RF output port 304, respectively, to DC isolate the circuit 300.

In various embodiments, the input port 302 may receive a radio frequency (RF) input signal (e.g., RF_IN), the output port 304 may present a radio frequency (RF) output signal (e.g., RF_OUT), the bias terminal 306 may receive the bias voltage BIAS1 and the bias terminal 308 may receive the bias voltage BIAS2. The bias voltages BIAS1 and BIAS2 may be used to bias the PIN diodes 312 and 320, respectively. In an example, the bias voltages BIAS1 and BIAS2 may comprise positive voltages configured to be below a respective knee voltage of one or more PIN diode(s) implementing the shunt PIN diodes 312 and 320.

In an example, the RF input port 302 may be coupled to a first terminal of the DC blocking capacitor 310. A second terminal of the DC blocking capacitor 310 may be coupled to a first (e.g., anode) terminal of the PIN diode 312, a first terminal of the RF choke 314, and a first terminal of the DC blocking capacitor 318. A second terminal of the DC blocking capacitor 318 may be coupled to a first (e.g., anode) terminal of the PIN diode 320, a first terminal of the RF choke 322, and a first terminal of the DC blocking capacitor 326. A second terminal of the DC blocking capacitor 326 may be coupled to the RF output port 404. A second terminal of the RF choke 314 may be coupled to a first terminal of the DC blocking capacitor 316 and the bias terminal 306. A second terminal of the RF choke 322 may be coupled to a first terminal of the DC blocking capacitor 324 and the bias terminal 308. A second (e.g., cathode) terminal of the PIN diode 312, a second (e.g., cathode) terminal of the PIN diode 320, a second terminal of the DC blocking capacitor 316, and a second terminal of the DC blocking capacitor 324 may be coupled to a circuit ground terminal or plane (e.g., GND). In various embodiments, the PIN diodes 312 and 320 may be implemented as any available PIN diode technology including, but not limited to, silicon (Si) diodes, gallium arsenide (GaAs) diodes, or gallium nitride (GaN) diodes.

In an example, the first (input) stage (e.g., PIN diode 312) may use a large diode to provide the coarse level of isolation with the desired power handling capability, while the second (output) stage (e.g., PIN diode 320), commonly referred to as the clean-up stage, may use a smaller diode to provide the remaining level of isolation with the desired low leakage characteristics and threshold level. If the limiter is desired to handle a very large input signal, a third stage with a larger diode may be added to the input. In general, for optimum limiter performance, the PIN diodes 312 and 320 of a multi-stage limiter are placed one quarter wavelength ($\lambda/4$) from each other.

In various embodiments, the bias voltages BIAS1 and BIAS2 comprise positive bias voltages that are applied to the PIN diode 312 and the PIN diode 320, respectively. The selected bias voltages are generally below the knee voltages of the respective PIN diode 312 and 320. As the bias voltages increase, but stay well below the knee voltages, the leakage characteristics of the PIN diodes 312 and 320 are enhanced. The biased PIN diodes 312 and 320 generally exhibit superior performance compared to non-biased diodes developed on a thinner epitaxial I-layer, and without significant degradation of the small signal characteristics (e.g., insertion loss, return losses, bandwidth, etc.). When used in conjunction with a multi-stage configuration, superior power handling with ultra-low leakage characteristics may be achieved on a thicker epitaxial I-layer.

Figure 5:
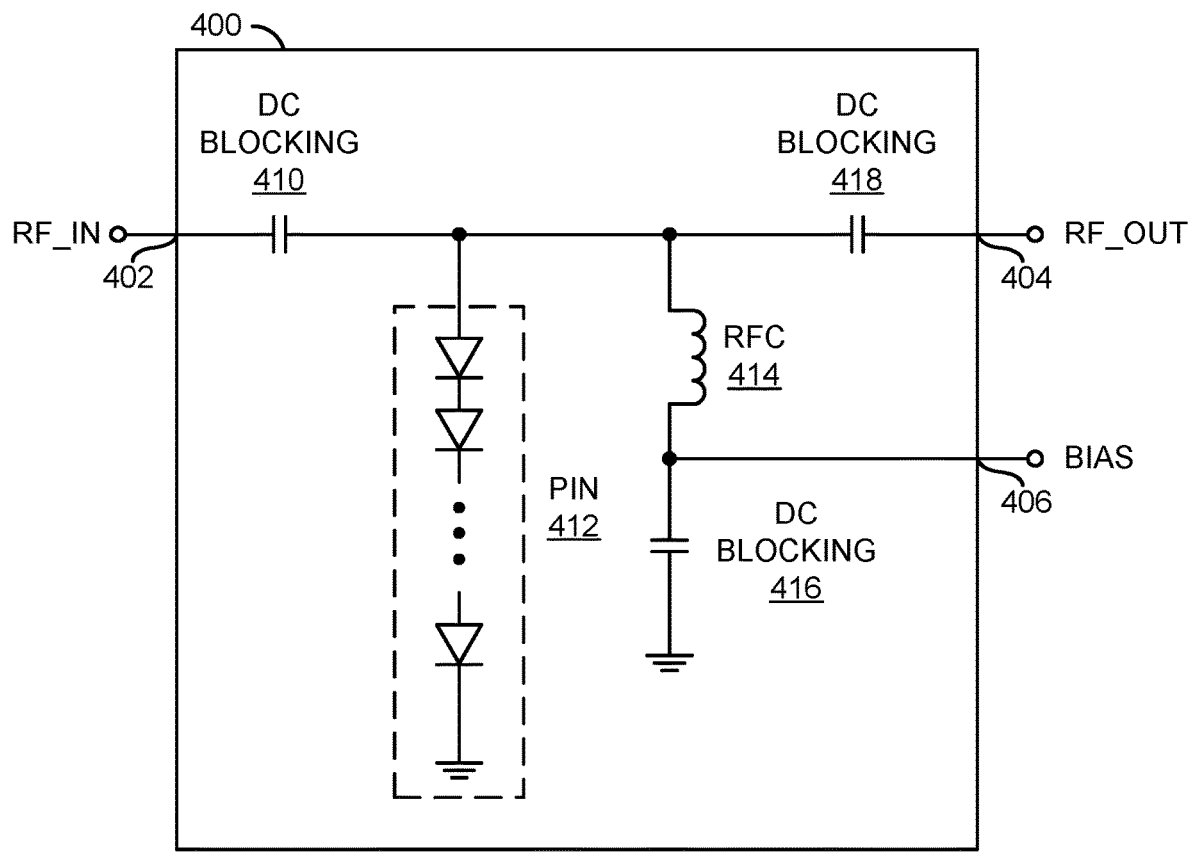
FIG. 5 is a diagram illustrating an example of a single-stage biased limiter in accordance with an example embodiment of the invention having a limiting shunt diode formed from a plurality of series connected diodes.

Referring to FIG. 5, a diagram of a circuit 400 is shown illustrating an example of a single-stage biased reflective limiter employing a combination of diodes in accordance with an example embodiment of the invention. In various embodiments implementing a single-stage limiter, the circuit 400 may comprise an RF input port 402, an RF output port 404, a bias terminal 406, a shunt PIN diode assembly 412, a parallel RF choke 414, and a DC blocking capacitor 416. The parallel RF choke 414 is selected to have a low DC resistance as to not alter the performances of diode assembly 412. The DC blocking capacitor 416 may be connected in series with the RF choke 414 for RF ground return. The circuit 400 may be implemented similarly to the circuit 100 (described above in connection with FIG. 2), except that the PIN diode assembly 412 generally comprises a combination of diodes connected in series. A DC blocking capacitor 410 and a DC blocking capacitor 418 may be inserted at the RF input port 402 and the RF output port 404, respectively, to DC isolate the circuit 400. In general, the DC blocking capacitor 410 and a DC blocking capacitor 418 do not directly contribute to the limiting characteristics of the circuit 400.

In various embodiments, the input port 402 may receive a radio frequency (RF) input signal (e.g., RF_IN), the output port 404 may present a radio frequency (RF) output signal (e.g., RF_OUT), and the bias terminal 406 may receive a bias voltage (e.g., BIAS). In an example, the bias voltage BIAS may comprise a positive voltage configured to be below a knee voltage of one or more PIN diode(s) implementing the shunt PIN diode assembly 412.

In an example, the RF input port 402 may be coupled to a first terminal of the DC blocking capacitor 410. A second terminal of the DC blocking capacitor 410 may be coupled to a first (e.g., anode) terminal of the PIN diode assembly 412, a first terminal of the RF choke 414, and a first terminal of the DC blocking capacitor 418. A second terminal of the DC blocking capacitor 418 may be coupled to the RF output port 404. A second terminal of the RF choke 414 may be coupled to a first terminal of the DC blocking capacitor 416 and the bias terminal 406. A second (e.g., cathode) terminal of the PIN diode assembly 412 and a second terminal of the DC blocking capacitor may be coupled to a circuit ground terminal or plane (e.g., GND). In various embodiments, the PIN diode assembly 412 may be implemented as any available PIN diode technology including, but not limited to silicon (Si) diodes, gallium arsenide (GaAs) diodes, or gallium nitride (GaN) diodes.

In various embodiments, the bias voltage BIAS comprises a positive bias voltage that is applied to the PIN diode assembly 412 of the limiter 400. The selected bias voltage is generally below a knee voltage of the PIN diode assembly 412. As the bias voltage increases, but stays well below the knee voltage, the leakage characteristics of the PIN diode assembly 412 are enhanced. The biased PIN diode assembly 412 generally exhibits superior performance compared to a non-biased diode assembly developed on a thinner epitaxial I-layer, and without significant degradation of the small signal characteristics (e.g., insertion loss, return losses, bandwidth, etc.).

Figure 6:
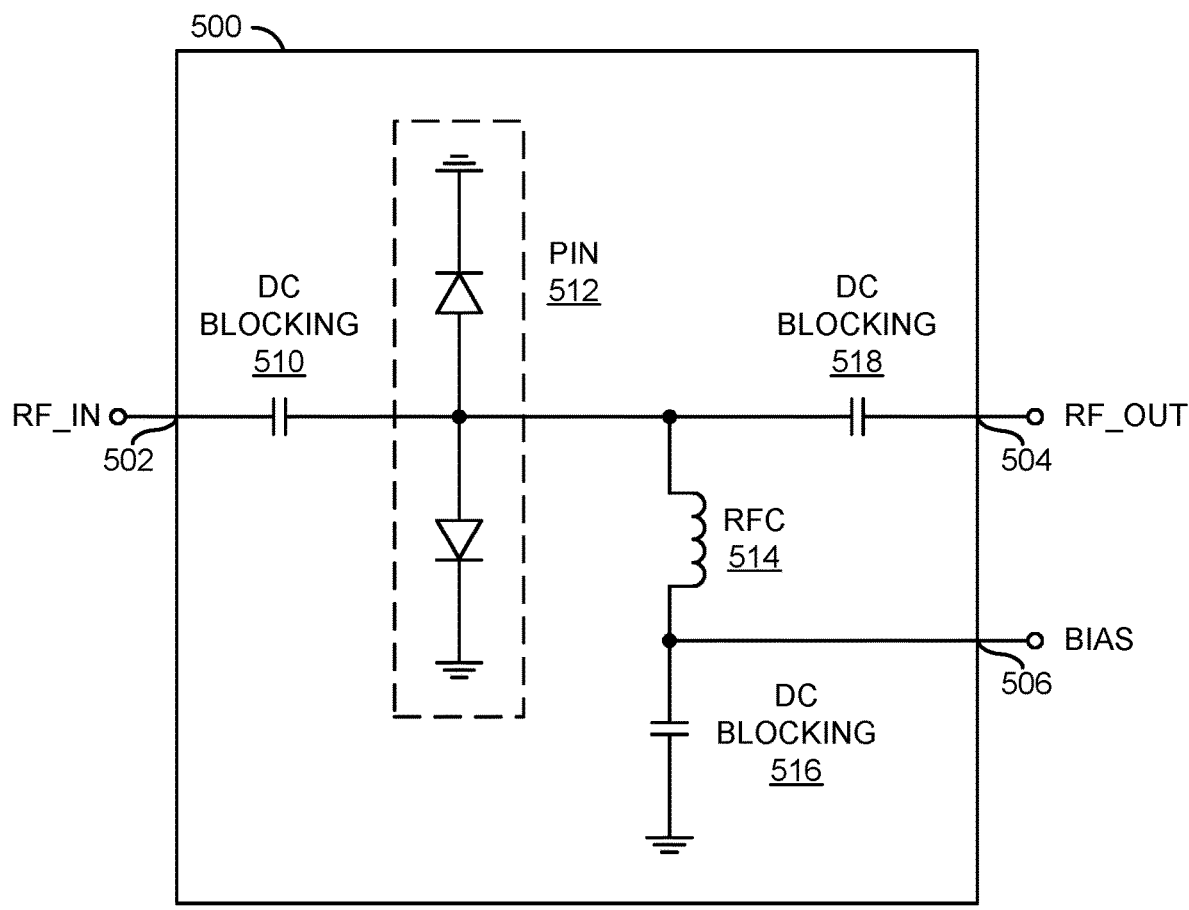
FIG. 6 is a diagram illustrating an example of a single-stage biased limiter in accordance with an example embodiment of the invention having a limiting shunt diode comprising a plurality of parallel-connected diodes.

Referring to FIG. 6, a diagram of a circuit 500 is shown illustrating another example of a single-stage biased reflective limiter employing a combination of diodes in accordance with another example embodiment of the invention. In various embodiments implementing a single-stage limiter, the circuit 500 may comprise an RF input port 502, an RF output port 504, a bias terminal 506, a shunt PIN diode assembly 512, a parallel RF choke 514, and a DC blocking capacitor 516. The parallel RF choke 514 is selected to have a low DC resistance as to not alter the performance of the diode assembly 512. The DC blocking capacitor 516 may be connected in series with the RF choke 514 for RF ground return. The circuit 500 may be implemented similarly to the circuit 100 (described above in connection with FIG. 2), except that the PIN diode assembly 512 generally comprises a combination of diodes connected in parallel. A DC blocking capacitor 510 and a DC blocking capacitor 518 may be inserted at the RF input port 502 and the RF output port 504, respectively, to DC isolate the circuit 500. In general, the DC blocking capacitor 510 and a DC blocking capacitor 518 do not directly contribute to the limiting characteristics of the circuit 500.

In various embodiments, the input port 502 may receive a radio frequency (RF) input signal (e.g., RF_IN), the output port 504 may present a radio frequency (RF) output signal (e.g., RF_OUT), and the bias terminal 506 may receive a bias voltage (e.g., BIAS). In an example, the bias voltage BIAS may comprise a positive voltage configured to be below a knee voltage of one or more PIN diode(s) implementing the shunt PIN diode 512.

In an example, the RF input port 502 may be coupled to a first terminal of the DC blocking capacitor 510. A second terminal of the DC blocking capacitor 510 may be coupled to a first (e.g., anode) terminal of the PIN diode assembly 512, a first terminal of the RF choke 514, and a first terminal of the DC blocking capacitor 518. A second terminal of the DC blocking capacitor 518 may be coupled to the RF output port 504. A second terminal of the RF choke 514 may be coupled to a first terminal of the DC blocking capacitor 516 and the bias terminal 506. A second (e.g., cathode) terminal of the PIN diode assembly 512 and a second terminal of the DC blocking capacitor may be coupled to a circuit ground terminal or plane (e.g., GND). In various embodiments, the PIN diode assembly 512 may be implemented as any available PIN diode technology including, but not limited to silicon (Si) diodes, gallium arsenide (GaAs) diodes, or gallium nitride (GaN) diodes.

In various embodiments, the bias voltage BIAS comprises a positive bias voltage that is applied to the PIN diode assembly 512 of the limiter 500. The selected bias voltage is generally below a knee voltage of the PIN diode assembly 512. As the bias voltage increases, but stays well below the knee voltage, the leakage characteristics of the PIN diode assembly 512 are enhanced. The biased PIN diode assembly 512 generally exhibits superior performance compared to a non-biased diode assembly developed on a thinner epitaxial I-layer, and without significant degradation of the small signal characteristics (e.g., insertion loss, return losses, bandwidth, etc.).

Figure 7:
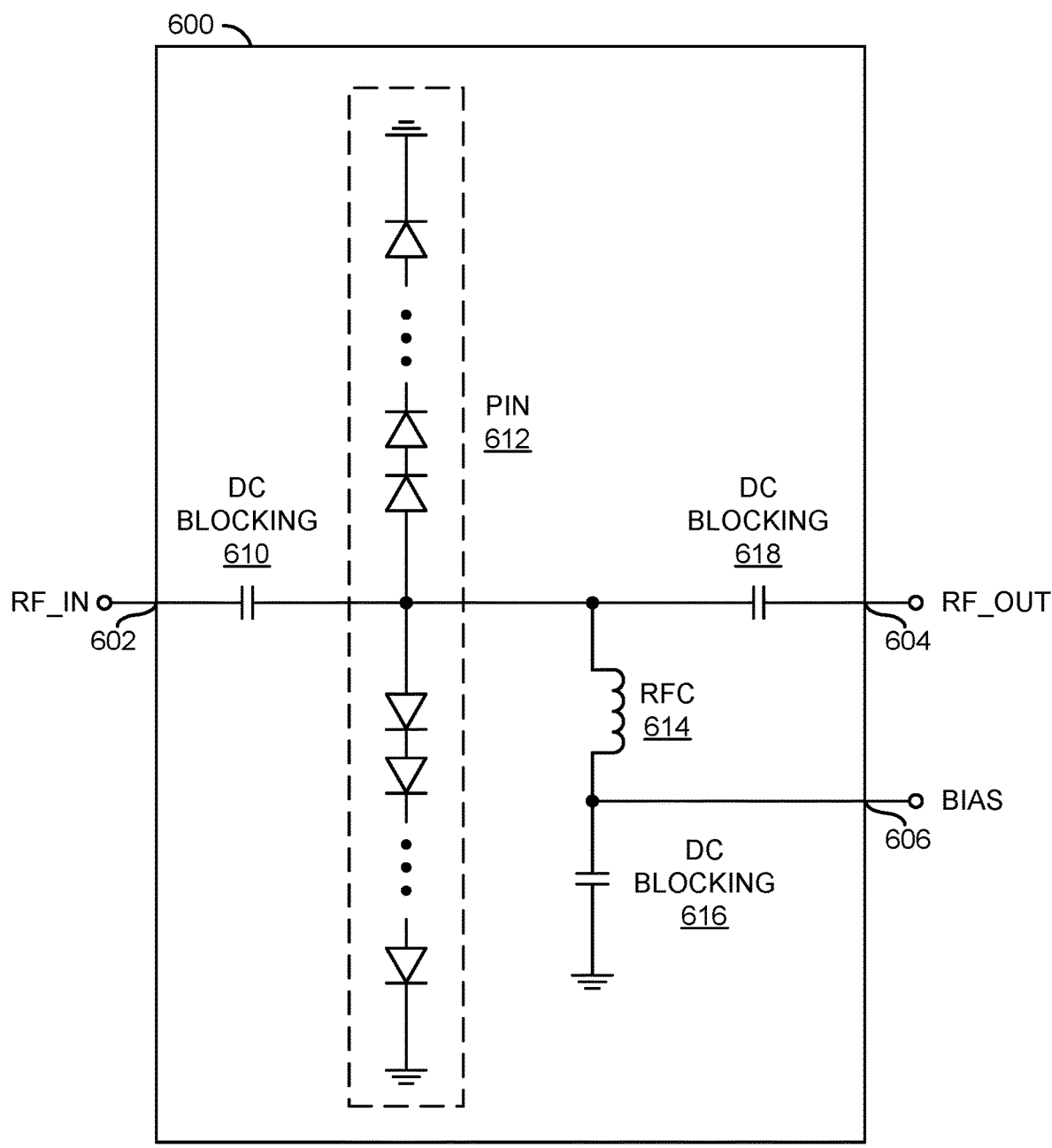
FIG. 7 is a diagram illustrating an example of a single-stage biased limiter in accordance with an example embodiment of the invention having a limiting shunt diode comprising combinations of series and parallel connected diodes.

Referring to FIG. 7, a diagram of a circuit 600 is shown illustrating still another example of a single-stage biased reflective limiter employing a combination of diodes in accordance with another example embodiment of the invention. In various embodiments implementing a single-stage limiter, the circuit 600 may comprise an RF input port 602, an RF output port 604, a bias terminal 606, a shunt PIN diode assembly 612, a parallel RF choke 614, and a DC blocking capacitor 616. The parallel RF choke 614 is selected to have a low DC resistance as to not alter the performance of the diode assembly 612. The DC blocking capacitor 616 may be connected in series with the RF choke 614 for RF ground return. The circuit 600 may be implemented similarly to the circuit 100 (described above in connection with FIG. 2), except that the PIN diode assembly 612 generally comprises a combination of diodes connected in series and parallel. A DC blocking capacitor 610 and a DC blocking capacitor 618 may be inserted at the RF input port 602 and the RF output port 604, respectively, to DC isolate the circuit 600. In general, the DC blocking capacitor 610 and a DC blocking capacitor 618 do not directly contribute to the limiting characteristics of the circuit 600.

In various embodiments, the input port 602 may receive a radio frequency (RF) input signal (e.g., RF_IN), the output port 604 may present a radio frequency (RF) output signal (e.g., RF_OUT), and the bias terminal 606 may receive a bias voltage (e.g., BIAS). In an example, the bias voltage BIAS may comprise a positive voltage configured to be below a knee voltage of one or more PIN diode(s) implementing the shunt PIN diode assembly 612.

In an example, the RF input port 602 may be coupled to a first terminal of the DC blocking capacitor 610. A second terminal of the DC blocking capacitor 610 may be coupled to a first (e.g., anode) terminal of the PIN diode assembly 612, a first terminal of the RF choke 614, and a first terminal of the DC blocking capacitor 618. A second terminal of the DC blocking capacitor 618 may be coupled to the RF output port 604. A second terminal of the RF choke 614 may be coupled to a first terminal of the DC blocking capacitor 616 and the bias terminal 606. A second (e.g., cathode) terminal of the PIN diode assembly 612 and a second terminal of the DC blocking capacitor may be coupled to a circuit ground terminal or plane (e.g., GND). In various embodiments, the PIN diode assembly 612 may be implemented as any available PIN diode technology including, but not limited to silicon (Si) diodes, gallium arsenide (GaAs) diodes, or gallium nitride (GaN) diodes.

In various embodiments, the bias voltage BIAS comprises a positive bias voltage that is applied to the PIN diode assembly 612 of the limiter 600. The selected bias voltage is generally below a knee voltage of the PIN diode assembly 612. As the bias voltage increases, but stays well below the knee voltage, the leakage characteristics of the PIN diode assembly 612 are enhanced. The biased PIN diode assembly 612 generally exhibits superior performance compared to a non-biased diode assembly developed on a thinner epitaxial I-layer, and without significant degradation of the small signal characteristics (e.g., insertion loss, return losses, bandwidth, etc.).

Figure 8:
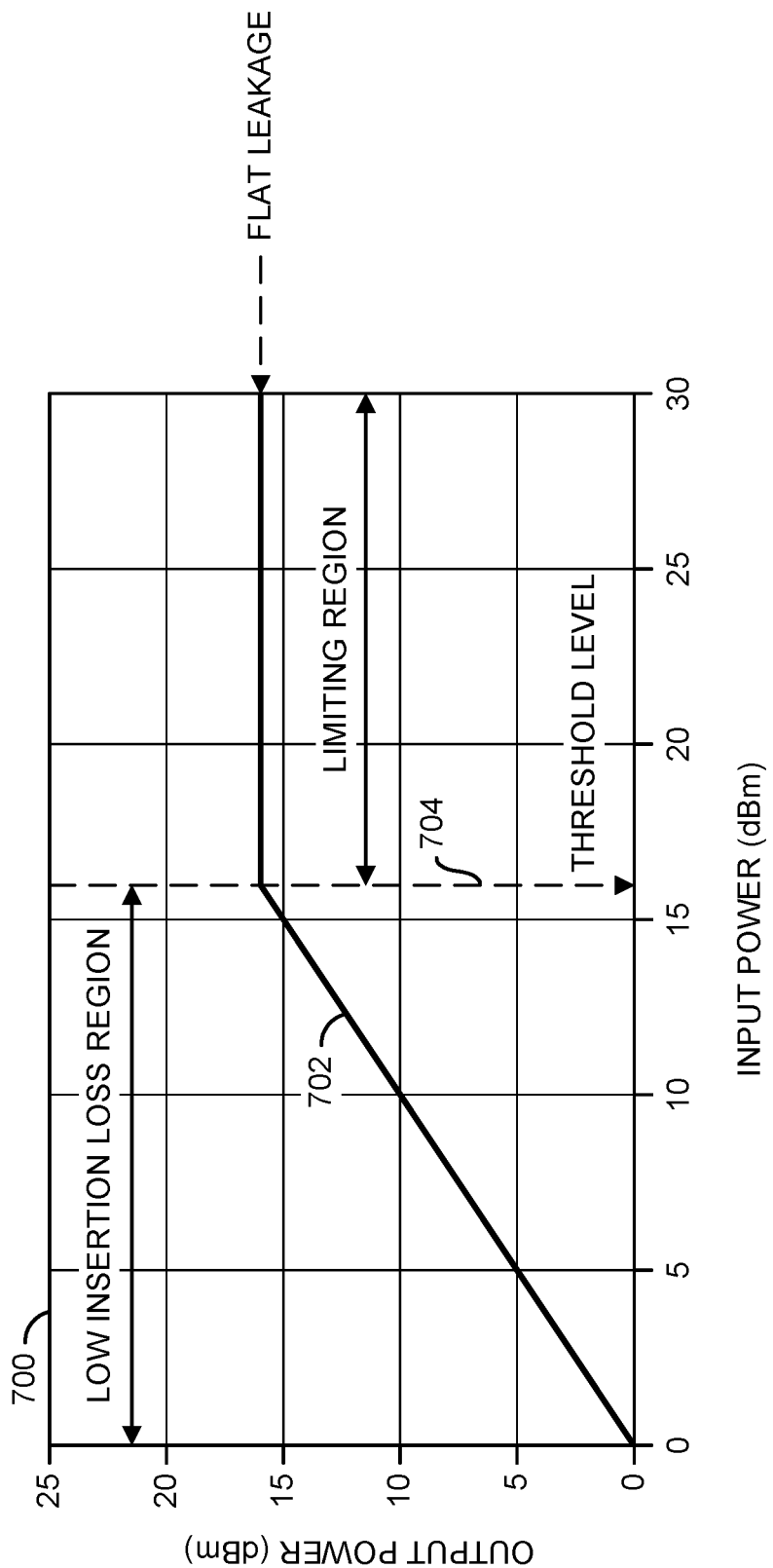
FIG. 8 is a diagram illustrating a typical transfer characteristic of an ideal reflective limiter.

Referring to FIG. 8, a diagram of a graph 700 is shown illustrating a transfer characteristic of an ideal single-stage passive reflective limiter unbiased. The transfer characteristic of the ideal limiter is generally represented as a curve 702. The transfer characteristic 702 may be divided into two regions; a low insertion loss region and a limiting region. The two regions are separated by a threshold level 704. An ideal limiter exhibits no insertion loss for a small incident power in order to not degrade the performance of the following receiver. When a large CW input signal (e.g., above the threshold level 704) is applied, the ideal limiter starts limiting and only part of the incident signal leaks through. The part of the incident signal that leaks through is referred to as the flat leakage characteristic of the limiter. In the case of reflective PIN diode limiters, the majority of the power that does not leak through the device (typically –0.90%) is reflected back towards the source. The reflected power needs to be safely dissipated or re-radiated by the antenna attached to the transceiver. The flat leakage characteristic as well as the threshold level of the limiter are key characteristics of the limiter, as they determine the level of isolation that may be provided to protect a receiver.

Figure 9:
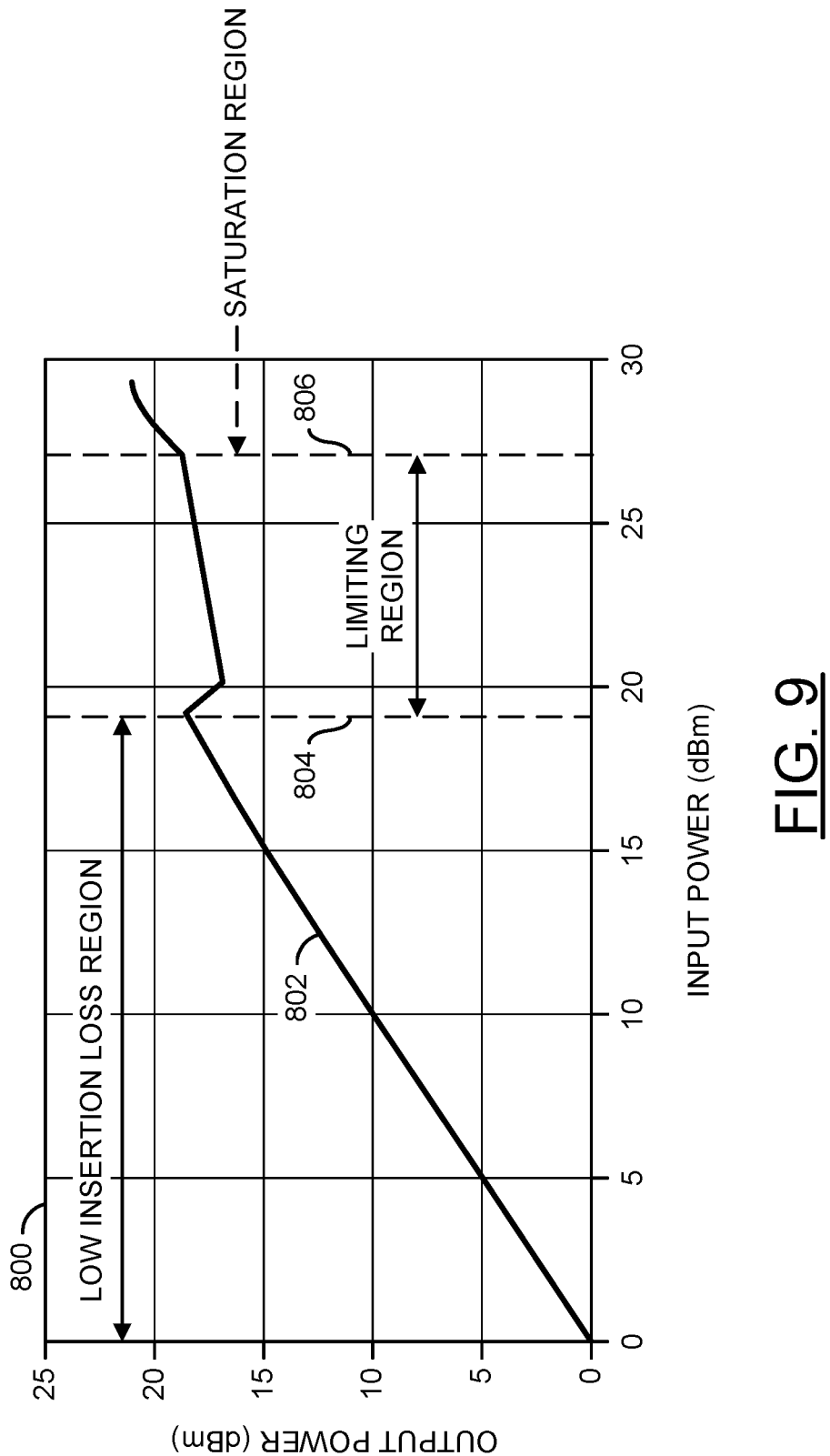
FIG. 9 is a diagram illustrating a typical transfer characteristic of an a single-stage reflective limiter.

Referring to FIG. 9, a diagram is shown illustrating a transfer characteristic of a single-stage reflective limiter unbiased. A typical transfer characteristic of a single-stage reflective limiter is generally represented as a curve 802. The transfer characteristic 802 may be divided into three regions; a low insertion loss region, a limiting region, and a saturation region. The low insertion loss region and the limiting region are shown separated by a threshold level 804. The limiting region and the saturation region are shown separated by a threshold level 806. In the limiting region, the flat leakage generally increases linearly with the CW input power until the limiter reaches the threshold level 806 of the saturation region. In the saturation region, the RF current through the limiting shunt diode increases rapidly with input power and eventually causes permanent damage to the diode. In practice, reflective limiters are operated below the saturation region.

Figure 10:
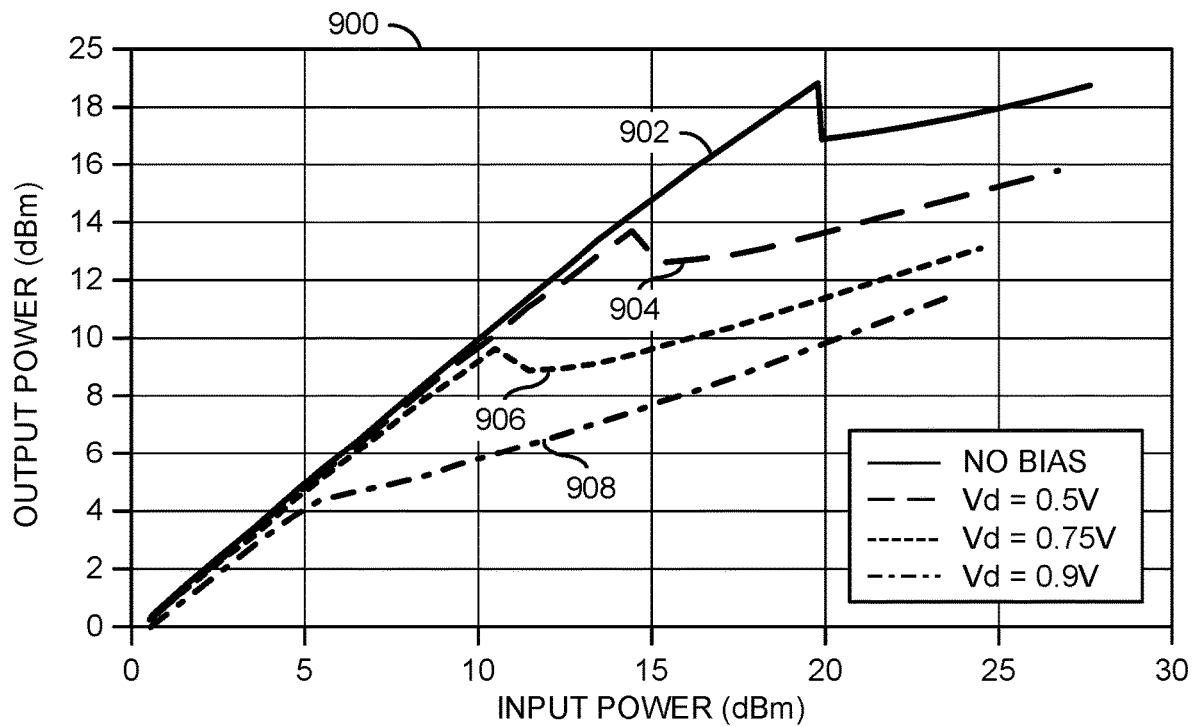
FIG. 10 is a diagram illustrating transfer characteristics of a single-stage reflective limiter in accordance with an example embodiment of the invention at various bias voltages.

Referring to FIG. 10, a graph 900 is shown illustrating transfer characteristics for a single-stage reflective limiter in accordance with an example embodiment of the invention. The graph 900 illustrates application of the present invention on a single-stage reflective limiter as shown in FIG. 2 and composed of a small AlGaAs PIN diode of 25 μm anode diameter on a 2 μm epitaxial I-layer thickness. This diode size is more appropriate for low power, low flat leakage applications (clean-up diode). Measurements were taken at 3 GHz. The knee voltage of such an AlGaAs PIN diode is rated at Vknee=1.3 V. Transfer characteristic curves are shown for both unbiased and forward biased in accordance with an example embodiment of the invention operation. In an example, a curve 902 illustrates a Pin/Pout transfer characteristic at 3 GHz for a limiter stage with the 25 μm PIN diode unbiased. A number of curves 904, 906, and 908 illustrate the Pin/Pout transfer characteristics at 3 GHz for the limiter stage with the 25 μm PIN diode forward biased at 0.5V, 0.75V, and 0.9V, respectively.

As the forward (bias) voltage Vd is increased to Vd=0.5 V, the limiter exhibits an improvement of the P1dB threshold level greater than 5 dB with an improvement of the flat leakage greater than 2.75 dB. The small signal insertion loss is unaffected by the applied voltage. As the forward voltage is increased to a higher value towards the knee voltage, the P1dB threshold level and flat leakage keep improving without significant degradation of the limiter small signal characteristics. At Vd=0.75 V, the improvement in the flat leakage compared to the unbiased limiter is greater than 5.5 dB with a slight degradation of the insertion loss of 0.16 dB. At Vd=0.9 V, the change in the energy band diagram of the diode becomes significant enough that the diode starts conducting, exhibiting a non-negligible series resistance. As a result the limiter insertion loss starts degrading. The improvement in the flat leakage compared to the unbiased limiter is greater than 7 dB with a degradation of the insertion loss of 0.4 dB.

Depending on the system and application, a slight increase in insertion loss may still be acceptable and within the overall system tolerance. When the forward voltage is further increased, the diode becomes fully conductive and behaves like an attenuator rather than a limiter.

Figure 11:
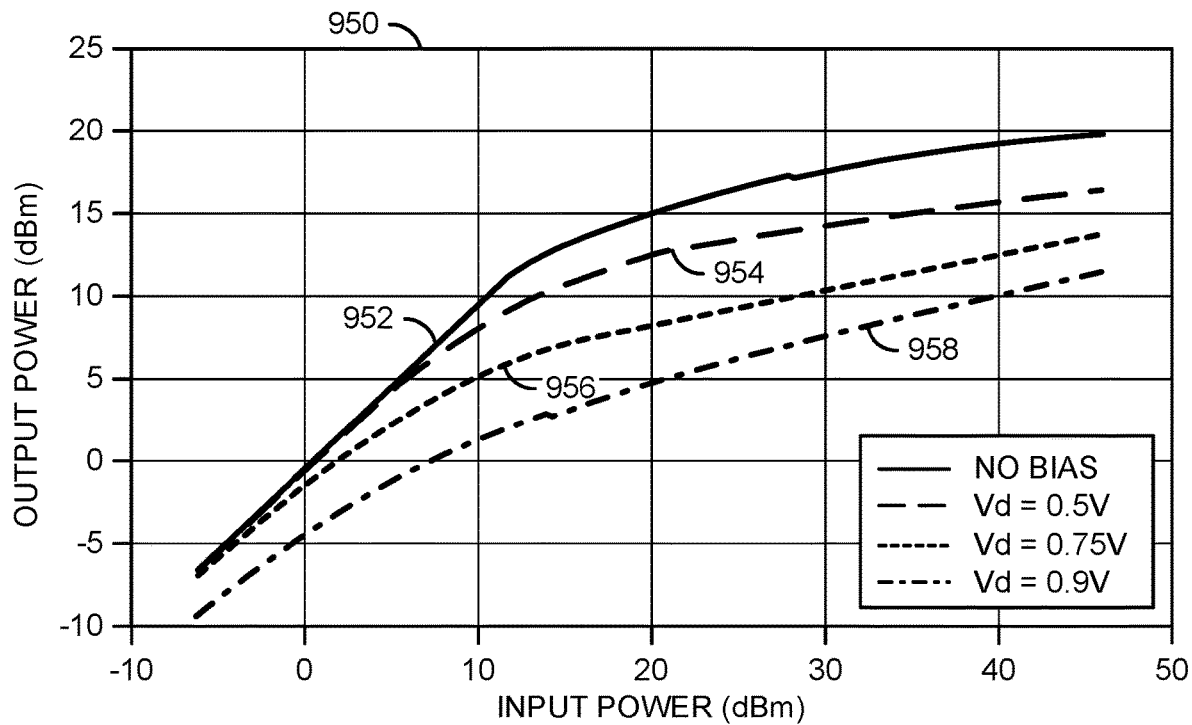
FIG. 11 is a diagram illustrating transfer characteristics of a single-stage reflective limiter in accordance with another example embodiment of the invention at various bias voltages.

Referring to FIG. 11, a graph 950 is shown illustrating transfer characteristics for a single-stage reflective limiter in accordance with another example embodiment of the invention. The graph 950 illustrates application of an embodiment of the present invention on a much larger AlGaAs PIN diode developed with a 192 μm anode diameter on a 3 μm thick epitaxial I-layer. The diode size of 192 μm diameter is appropriate for applications requiring high power handling with a coarse isolation requirement (e.g., coarse limiting diode). Measurements were taken at 450 MHz as to not be affected by the mismatch on the diode. In an example, a curve 952 illustrates a Pin/Pout transfer characteristic at 450 MHz for a limiter stage with an unbiased 192 μm PIN diode having an epitaxial I-layer thickness of 3 μm. A curve 954 illustrates the Pin/Pout transfer characteristic at 450 MHz for the limiter stage with the 192 μm PIN diode forward biased at 0.5V. A curve 956 illustrates the Pin/Pout transfer characteristic at 450 MHz for the limiter stage with the 192 μm PIN diode forward biased at 0.75V. A curve 958 illustrates the Pin/Pout transfer characteristic at 450 MHz for the limiter stage with the 192 μm PIN diode forward biased at 0.9V.

As shown on FIG. 11, application of a Vd=0.5 V forward bias significantly improves the flat leakage of the limiter by more than 3 dB without any degradation of the small-signal insertion loss. Further increase of the forward voltage to Vd=0.75 V leads to higher isolation with a global improvement of the flat leakage of more than 6 dB and a slight increase in the insertion loss of 0.4 dB compared to the unbiased limiter. At Vd=0.9 V, the change in the energy band diagram of the diode becomes significant enough that the diode starts conducting, and for a large diode, induces a non-negligible degradation of the insertion loss of the limiter.

FIGS. 10 and 11 generally illustrate that the present invention may be exploited regardless of the diode physical characteristics (notably thickness of the epitaxial I-layer), diode size, and frequency of the incident signal. Significantly greater improvement of the flat leakage characteristic may be achieved by applying a forward bias rather than by thinning the epitaxial I-layer. FIGS. 10 and 11 also illustrate that the present invention may be exploited to control the P1dB threshold level at which the limiter exhibits a 1 dB compression of the input signal. As the forward bias voltage applied to the diode remains well below the knee voltage of the diode, degradation of the insertion loss of the limiter is negligible.

The invention described above generally provides a method and/or apparatus for improving the response of reflective PIN diode limiters to a large signal by lowering the leakage characteristics and 1 dB compression threshold level without significantly compromising the small signal and power characteristics of the circuit. In various embodiments, a diode or diodes are biased at a positive voltage below the knee voltage of the diode(s). In general, the technique in accordance with an embodiment of the invention is particularly suited to improve the performance of reflective PIN diode-based MMIC limiters. The present invention may be applied to single-stage reflective diode limiters as well as multi-stage limiters. Depending on the desired performance, one or multiple diodes of the limiter may be biased either at the same bias voltage (as illustrated in FIG. 3) or at different bias voltages (as illustrated in FIG. 4), as long as each individual bias voltage stays positive and below the knee voltage of the respective diode so as to not alter the small signal and/or power characteristics of the limiter if un-biased (VD=0V). Additionally, the present invention still applies if the limiting shunt diode of each limiter stage is composed of a single diode (e.g., as shown in FIGS. 2, 3, and 4) or is composed of multiple diodes in a series and/or parallel configuration (e.g., as illustrated in FIGS. 5, 6, and 7) for a single-stage biased limiter.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
an input port;
an output port;
a first bias input;
a first shunt PIN diode;
a first radio frequency (RF) choke inductor; and
a first direct current (DC) blocking capacitor, wherein (i) said input port is connected to said output port, a first terminal of said first shunt PIN diode, and a first terminal of said first RF choke inductor, (ii) a second terminal of said first RF choke inductor is connected to a first terminal of said first DC blocking capacitor and said first bias input, (iii) a second terminal of said first shunt PIN diode and a second terminal of said first DC blocking capacitor are connected to a circuit ground potential, and (iv) a bias circuit is configured to provide a first bias voltage having a magnitude lower than a knee voltage of said first shunt PIN diode at said first bias input.

2. The apparatus according to claim 1, further comprising:
a second DC blocking capacitor coupled between said input port and said first terminal of said first shunt PIN diode; and
a third DC blocking capacitor coupled between said output port and said first terminal of said first shunt PIN diode.

3. The apparatus according to claim 1, further comprising:
a second shunt PIN diode connected between said input port and said output port in parallel with said first shunt PIN diode, wherein said first shunt PIN diode and said second shunt PIN diode are separated by a distance of a quarter wavelength of an operating frequency of said apparatus.

4. The apparatus according to claim 3, further comprising:
a second DC blocking capacitor coupled between said input port and said first terminal of said first shunt PIN diode; and
a third DC blocking capacitor coupled between said output port and said first terminal of said second shunt PIN diode.

5. The apparatus according to claim 3, wherein said apparatus comprises a hybrid limiter.

6. The apparatus according to claim 3, further comprising:
a second bias input;
a second RF choke inductor;
a second DC blocking capacitor; and
a third DC blocking capacitor, wherein (i) a first terminal of said second RF choke inductor is connected to a said output port, (ii) a second terminal of said second RF choke inductor is connected to a first terminal of said second DC blocking capacitor and said second bias input, (iii) a second terminal of said second DC blocking capacitor is connected to said circuit ground potential, (iv) a second bias voltage having a magnitude lower than a knee voltage of said second shunt PIN diode is applied at said second bias input, (v) a first terminal of said third DC blocking capacitor is connected to the input port, the first terminal of said first shunt PIN diode, and the first terminal of said first RF choke inductor, and (vi) a second terminal of said third DC blocking capacitor is connected to said first terminal of said second shunt PIN diode, and said first terminal of said second RF choke inductor, and said output port.

7. The apparatus according to claim 6, further comprising:
a fourth DC blocking capacitor coupled between said input port and said first terminal of said first shunt PIN diode; and
a fifth DC blocking capacitor coupled between said output port and said first terminal of said second shunt PIN diode.

8. The apparatus according to claim 6, wherein said apparatus comprises a hybrid limiter.

9. The apparatus according to claim 1, wherein said apparatus implements a receiver protection limiter.

10. The apparatus according to claim 9, wherein said receiver protection limiter is part of a receiver chain.

11. The apparatus according to claim 10, wherein said receiver chain is part of a transceiver.

12. The apparatus according to claim 9, wherein said receiver protection limiter is constructed with discrete components.

13. The apparatus according to claim 9, wherein said receiver protection limiter is constructed on a monolithic microwave integrated circuit (MMIC).

14. The apparatus according to claim 1, wherein said first bias voltage is adjusted to control at least one of a leakage characteristic or a 1 dB compression threshold level of said apparatus.

15. A wireless front-end module receiver protection limiter comprising:
an input port;
an output port;
a first bias input;
a first shunt PIN diode;
a first radio frequency (RF) choke inductor; and
a first direct current (DC) blocking capacitor, wherein (i) said input port is connected to said output port, a first terminal of said first shunt PIN diode, and a first terminal of said first RF choke inductor, (ii) a second terminal of said first RF choke inductor is connected to a first terminal of said first DC blocking capacitor and said first bias input, (iii) a second terminal of said first shunt PIN diode and a second terminal of said first DC blocking capacitor are connected to a circuit ground potential, and (iv) a bias circuit is configured to provide a first bias voltage having a magnitude lower than a knee voltage of said first shunt PIN diode at said first bias input.

16. A method of improving leakage characteristics and 1 dB compression threshold level of a reflective limiter comprising:
connecting an input port of the reflective limiter to an output port of the reflective limiter, a first terminal of a first shunt PIN diode, and a first terminal of a first RF choke inductor;
connecting a second terminal of said first RF choke inductor to a first terminal of a first DC blocking capacitor and a first bias input;
connecting a second terminal of said first shunt PIN diode and a second terminal of said first DC blocking capacitor to a circuit ground potential; and
applying a first bias voltage having a magnitude lower than a knee voltage of said first shunt PIN diode at said first bias input.

17. The method according to claim 16, wherein said first bias voltage is adjusted to control at least one of a flat leakage characteristic, a spike leakage characteristic, or a 1 dB compression threshold level of said reflective limiter.

18. The method according to claim 16, further comprising:
connecting a second shunt PIN diode between said input port and said output port in parallel with said first shunt PIN diode, wherein said first shunt PIN diode and said second shunt PIN diode are separated by a distance of a quarter wavelength of an operating frequency of said reflective limiter.

19. The method according to claim 18, further comprising:
connecting a first terminal of a second RF choke inductor to said output port;
connecting a second terminal of said second RF choke inductor to a first terminal of a second DC blocking capacitor and a second bias input;
connecting a second terminal of said second DC blocking capacitor to said circuit ground potential;
connecting a first terminal of a third DC blocking capacitor to the input port, the first terminal of said first shunt PIN diode, and the first terminal of said first RF choke inductor;
connecting a second terminal of said third DC blocking capacitor to said first terminal of said second shunt PIN diode, said first terminal of said second RF choke inductor, and said output port; and
applying a second bias voltage having a magnitude lower than a knee voltage of said second shunt PIN diode at said second bias input.

20. The method according to claim 19, wherein said first bias voltage and said second bias voltage are adjusted to control at least one of a flat leakage characteristic, a spike leakage characteristic, or a 1 dB compression threshold level of said reflective limiter.

* * * * *